(12) United States Patent
Kikuchi

(10) Patent No.: US 6,399,260 B1
(45) Date of Patent: Jun. 4, 2002

(54) PATTERN EXPOSURE METHOD HAVING NO UNIFORMITY IN PATTERN DENSITY OR CONFIGURATION

(75) Inventor: Koji Kikuchi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/533,821

(22) Filed: Mar. 24, 2000

(30) Foreign Application Priority Data

Mar. 26, 1999 (JP) .......................................... 11-084313

(51) Int. Cl.$^7$ ................................................. G03F 9/00
(52) U.S. Cl. ......................................... 430/30; 430/296
(58) Field of Search ............................... 430/30, 5, 296

(56) References Cited

U.S. PATENT DOCUMENTS

| | | | |
|---|---|---|---|
| 6,087,052 A | * | 7/2000 | Manabe et al. ............... 430/30 |
| 6,117,600 A | * | 9/2000 | Nakasuji ...................... 430/30 |
| 6,168,891 B1 | * | 1/2001 | Shibata ........................ 430/30 |

\* cited by examiner

*Primary Examiner*—Christopher G. Young
(74) *Attorney, Agent, or Firm*—Ronald P. Kananen; Rader, Fishman & Grauer PLLC

(57) ABSTRACT

An object of the present invention is to enable a pattern exposure with high resolution, while assuring the process tolerance in a pattern of different density on the same layer, in the pattern exposure. A pattern exposure system, comprising: a pattern data input unit (11); a pattern detecting unit (12) for detecting a pattern portion having the same density based on the pattern data; a processing simulating means (14) for simulating the exposure by use of an exposure condition relative to each pattern portion detected from said pattern detecting unit (12); a condition setting unit (15) for defining a condition for exposure according to the simulation; a judging unit (16) for judging a pattern portion having the minimum tolerance; a mask bias operating unit (16) for calculating to adjust the other pattern portions to the optimum condition for the pattern portion judged to have the minimum tolerance by said judging unit (16) and operating the mask bias for making the tolerance maximum; and an output unit (18), which enables a pattern exposure with high resolution, while assuring the process tolerance in a pattern of different density on the same layer, by adopting the process of diving a desired exposure pattern into pattern portions of the substantially same density and extracting the same portions.

2 Claims, 6 Drawing Sheets

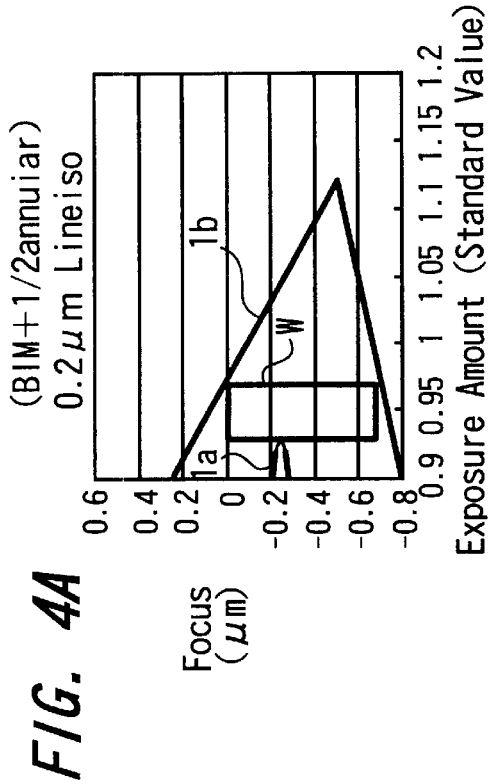
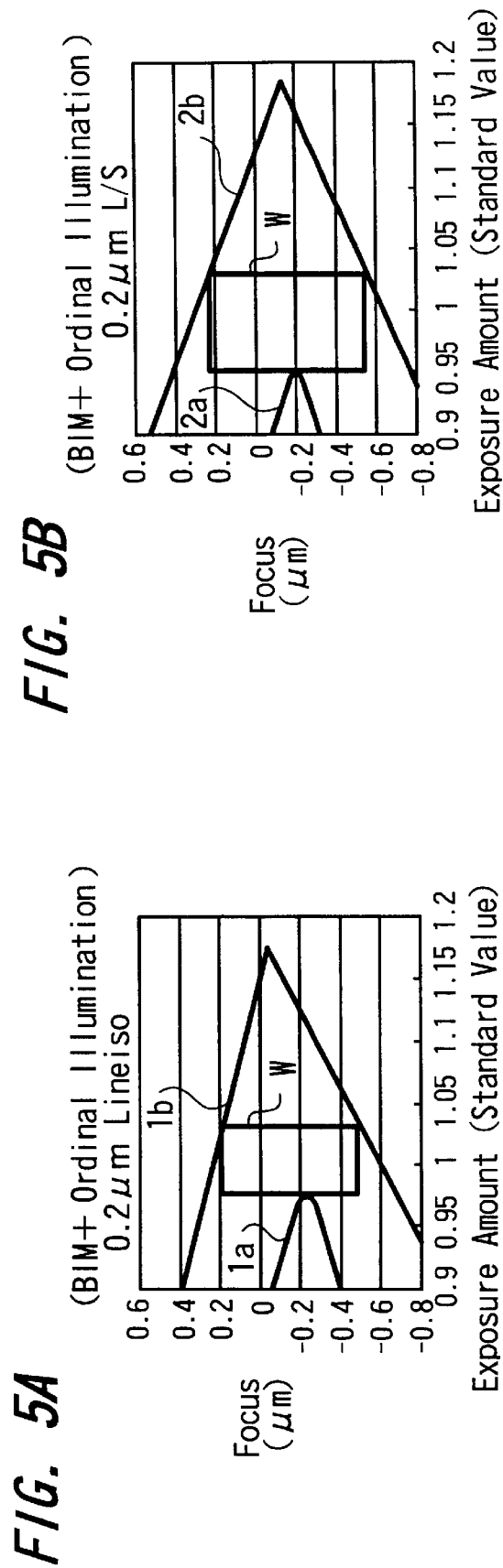
FIG. 4A
FIG. 4B
FIG. 5A
FIG. 5B

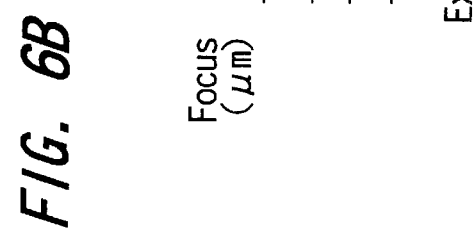
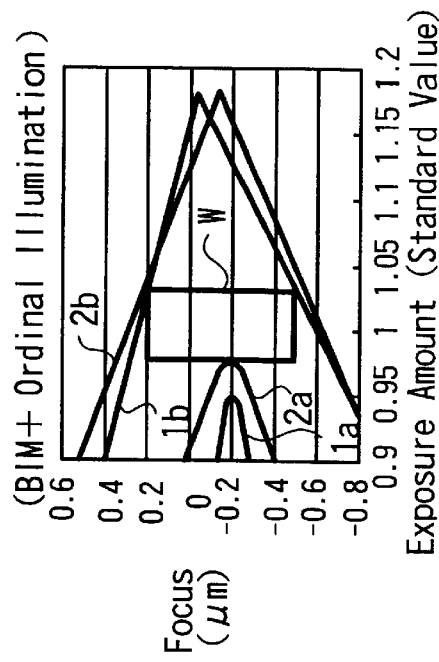
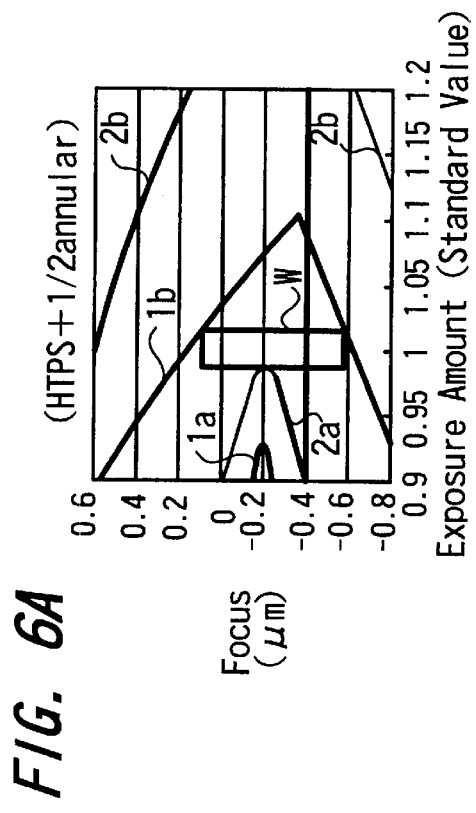
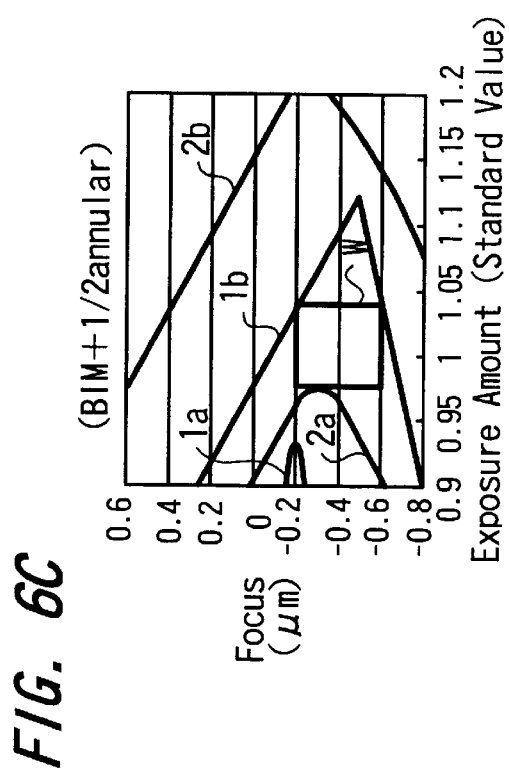
FIG. 6A (HTPS+1/2annular)
FIG. 6B (HTPSM+Ordinal Illumination)
FIG. 6C (BIM+1/2annular)
FIG. 6D (BIM+Ordinal Illumination)

PATTERN EXPOSURE METHOD HAVING NO UNIFORMITY IN PATTERN DENSITY OR CONFIGURATION

BACKGROUNDS OF THE INVENTION

1. Field of the Invention

The present invention relates to a preferable pattern exposure method for use in, for example, the photolithography process in the manufacturing process of a semiconductor device.

2. Description of the Related Art

Recently, a system LSI (Large Scale Integrated Circuit), for example, having a logic portion and a memory portion mixedly or a system LSI having a portion including a lot of functions on a common semiconductor chip, is remarkably developed.

In this case, a repeated pattern of a cell portion is formed, for example, in a DRAM (Dynamic Random Access Memory) forming a memory portion, and a pattern of low density different from the memory portion in width and intervals according to the array of a gate is formed in a logic portion.

In the manufacture of a semiconductor device, a fine pattern of each portion is formed by photolithography, and especially in the manufacture of the above-mentioned system LSI, it is necessary to do exposure in the photolithography process under the same condition as for a pattern different in density and shape on the same layer.

In order to obtain a desired pattern accurately by the photolithography, it is necessary to set the optimum exposure condition depending on the pattern density and configuration, more specifically, including selection of light source for exposure, optical characteristic of an optical system, exposure amount, characteristic of a used mask, photoresist, and mask bias. As mentioned above, in the case of obtaining a pattern different in the density and configuration on the same layer, generally, a method of exposing a photoresist layer and developing it as for the whole pattern under the best condition, and finding a condition capable of getting the best mask lineality and the maximum tolerance in the depth of focus and the exposure amount, thereby to expose the photoresist layer as for the whole pattern, is used.

According to this method, there is a risk of failing to assure the tolerance in the depth of focus and the exposure amount, although the using condition meets the resolution under the same exposure condition of the different pattern density and configuration. Further, this method deteriorates the improvement in resolution ability and process tolerance, that is the original object of illumination variation and phase shift mask in selecting a mask, thereby deteriorating the defect rate in a mass production.

SUMMARY OF THE INVENTION

An object of the present invention is to enable a pattern exposure of high resolution, while assuring the process tolerance in a pattern of different density and configuration on the same layer, in the pattern exposure of, for example, photolithography, in a manufacturing process of a semiconductor device such as the above-mentioned system LSI.

The pattern exposure method according to the present invention includes a work of dividing a desired exposure pattern into pattern portions of each substantially same density and configuration and extracting the same pattern portions, at first, in the pattern exposure of the desired pattern having no uniformity in density and configuration.

In the case of the pattern exposure of a desired pattern having no uniformity in density and configuration, in the conventional way, exposure is made on the whole exposure pattern under a condition as proper as possible. On the contrary, the present invention is to include the work of dividing a desired exposure pattern into pattern portions of each substantially same density and configuration and extracting the same portions, thereby to optimize the exposure of each pattern assuredly, and thereafter apply the exposure condition of a pattern portion having the minimum process tolerance to the other pattern portions. At this time, mask bias optical proximity effect correction is performed so to make the optimum exposure amount in one accord.

BRIEF DESCRIPTION OF THE DRAWINGS

FIG. 2 is a view showing the exposure amount and focus tolerance in the case of using the HTPSM and half annular illumination in one process according to the method of the present invention.

FIG. 3 is a view showing the exposure amount and focus tolerance in the case of using the HTPSM and ordinal illumination in one process according to the method of the present invention.

FIG. 4 is a view showing the exposure amount and focus tolerance in the case of using the BIM and ordinal illumination in one process according to the method of the present invention; wherein FIG. 4A shows the case of the iso pattern of line width 0.2 m, and FIG. 4B shows the case of the line-and-space pattern of line width 0.2 m;

FIG. 5 is a view showing the exposure amount and focus tolerance in the case of using the BIM and half annular illumination in one process according to the method of the present invention; wherein FIG. 5A shows the case of the iso pattern of line width 0.2 m, and FIG. 5B shows the case of the line-and-space pattern of line width 0.2 m;

FIGS. 6A to 6D are views showing the exposure amount and focus tolerance under each mask and illumination condition;

DETAILED DESCRIPTION OF THE PREFERRED EMBODIMENT

Figure 1:
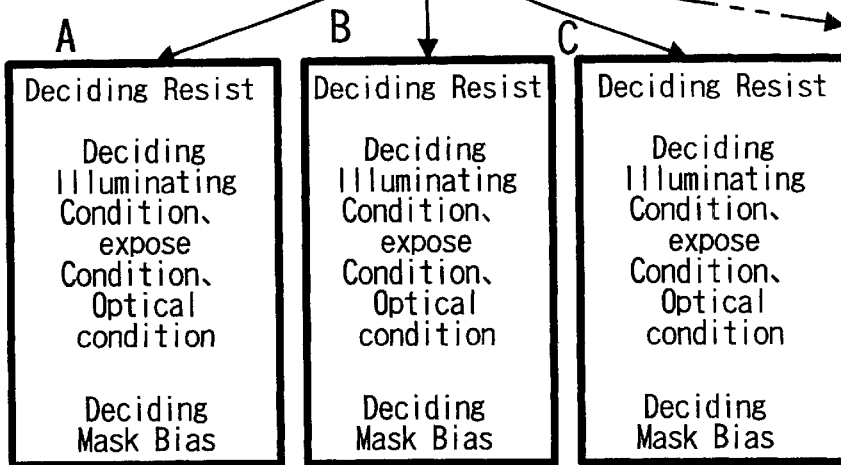
FIG. 1 is a work flow chart of an embodiment of a pattern exposure method according to the present invention.

An embodiment according to the present invention will be described with reference to the flow chart of FIG. 1. In this embodiment, the description will be made, for example, in the case of performing the pattern exposure on a photoresist in the manufacturing process of a semiconductor.

At first, when forming a desired exposure pattern, having a pattern different in density and configuration on the same layer, the same pattern is divided into some portions each having the substantially same density and configuration, more specifically, some portions A, B, C, . . . each having the same line width and the same pitch (work 1).

Next, the maximum exposure condition is decided for getting each window having the maximum tolerance in exposure amount and depth of focus as for the divided pattern portions A, B, C, . . . , that is, ED (Exposure Defocus)-window. More specifically, a photoresist to be used is decided, the optimum exposure condition, that is, optical condition, illuminating condition, and working condition such as exposure amount are decided, and further mask bias is decided (work II).

The minimum ED-window of the ED-windows relative to the respective pattern portions A, B, C, . . . , namely the extracted pattern portion of the minimum tolerance, is selected. In FIG. 1, the pattern A is selected (work III).

The other patterned ED-windows are adjusted by this minimum ED-window. In the other words, the optimum exposure condition of the pattern A is adopted also in the other extracted pattern portions, and by the adjustment of the OPC (Optical Proximity effect Correction), the optimum exposure condition on the whole pattern is obtained (work IV).

According to this condition, exposure of the whole pattern on the above-mentioned layer, namely pattern exposure on a photoresist layer is performed.

Thereafter, for example, the photoresist layer is developed, and by use of this patterned photoresist layer as an etching mask, pattern etching is performed in the semiconductor manufacturing process.

The description will be made by way of example in the case of adopting the present invention in an LSI mixedly having a logic portion and a memory portion of DRAM having 0.2 $\mu$m gate length.

For the sake of convenience, a desired pattern is divided into pattern A and pattern B, and each pattern is extracted. The pattern A of an isolated pattern (hereinafter, referred to as iso) having 0.2 $\mu$m line width, corresponding to a logic portion gate, and the pattern B of, what is called, a line-and-space pattern (hereinafter, referred to as L/S) having 0.2 $\mu$m line width and 0.5 $\mu$m pitch, corresponding to the DRAM gate, are prepared.

The working condition for exposure, as for the patterns A and B, namely, exposure optical condition, illuminating condition, working condition such as exposure amount, mask condition and the like, are optimized.

An object to be exposed in this example is a film obtained by 70 nm thick spin-coating the Si substrate with antireflection coating referred to as DUV42 made by Nissan Chemistry, Ltd.

On this film, a photoresist layer is applied. As this photoresist, the t-BOC chemically amplified resist, referred to as K-1092 manufactured by JSR, LTD., is used.

As the developer of this resist coater, the ACT8 resist coater manufactured by Tokyo Electron, Ltd. is used to spin-coat 540 nm thick at 3380 rpm. Thereafter, this resist is pre-baked at 90° C. for 60 seconds.

As a stepper, the stepper known as NSR-2205EX12B made by Nikon, Ltd. is employed.

After this exposure, post-exposure bake is performed at 105° C. for 90 seconds, puddle development is performed for 60 seconds with 2.38% of TMAH (Tetra Methyl Ammonium Hydroxide) developer, and after rinse of pure water, post-bake is performed at 90° C. for 100 seconds.

FIGS. 2 to 5 show the results of the maximum range of tolerance in exposure amount (standard value) and focus obtained by setting each mask condition and illuminating condition when the line width is 0.20 $\mu$m±0.02 $\mu$m, and the reference letter W indicates the ED-window. Each view A shows the case of the iso pattern, and each view B shows the case of the L/S pattern. In each view A and B, curved lines 1a and 2a indicate the boundary where the line width 0.22 $\mu$m can be obtained, and curved lines 1b and 2b indicate the boundary where the line width 0.18 $\mu$m can be obtained. Namely, the range of 0.20 $\mu$m±0.02 $\mu$m corresponds to the portion between the curved lines 1a and 1b and between the curved lines 2a and 2b.

Figure 2A:
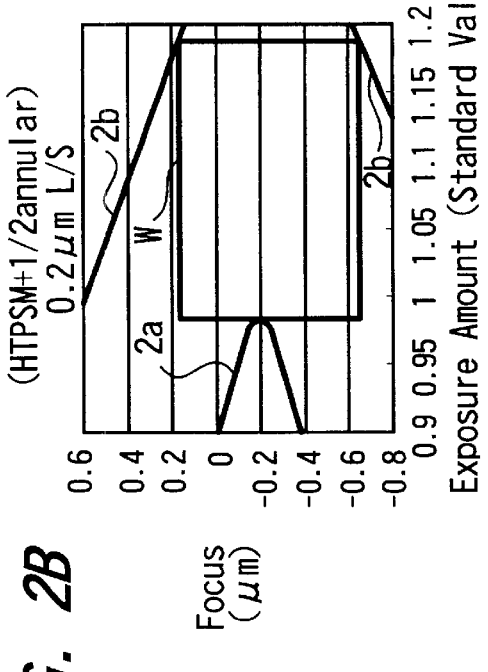
FIG. 2A shows the case of the iso pattern of line width 0.2 $\mu$m.
Figure 3A:
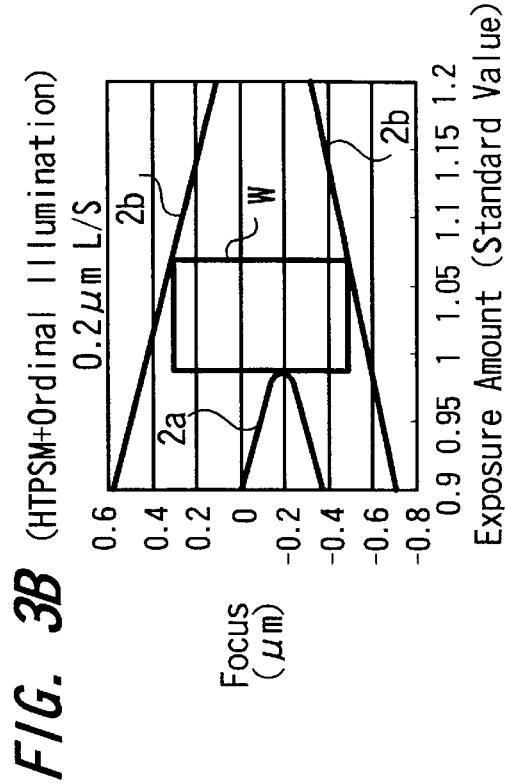
FIG. 3A shows the case of the iso pattern of line width 0.2 $\mu$m.
Figure 2B:
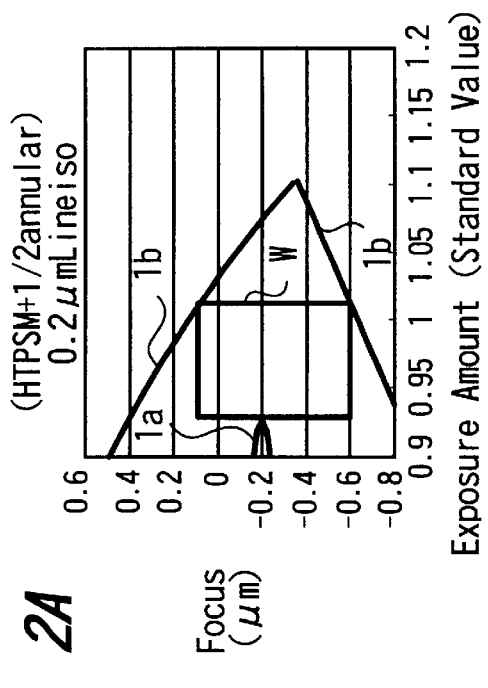
FIG. 2B shows the case of the line-and-space pattern of line width 0.2 $\mu$m.
Figure 3B:
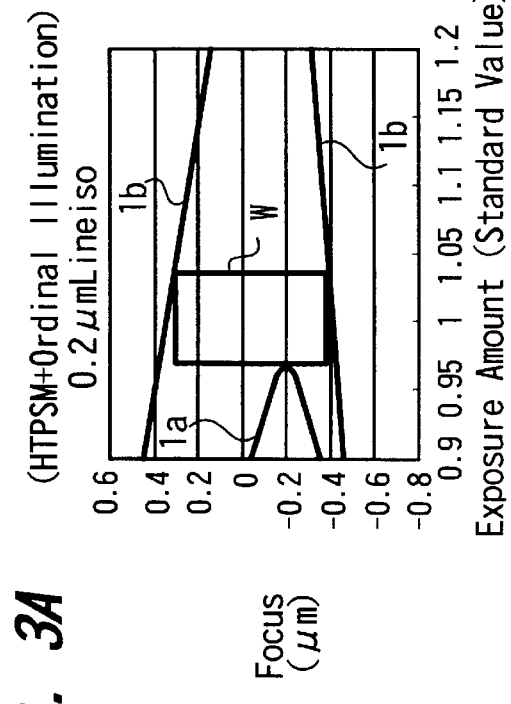
FIG. 3B shows the case of the line-and-space pattern of line width 0.2 $\mu$m.

The stepper used in this case is the following stepper; N.A. (Numerical Aperture)=0.55, the ratio of the numerical aperture between an illumination optical system and a projection optical system, namely the ratio of the pupil radius between the light source and the projection optical system)=0.80. FIG. 2, having FIGS. 2A and 2B, shows the case of using the HTPSM (Half Tone Phase Shift Mask) as a mask and an annular illumination of half shading; FIG. 3, having FIGS. 3A and 3B, shows the case of using the HTPSM and the ordinal illumination, FIG. 4, having FIGS. 4A and 4B, shows the case of using the ordinal mask that is the BIM (Binary Intensity Mask) and the above half shading annular illumination; and FIG. 5 shows the case of using the BIM and the ordinal illumination.

Table 1 shows the depth of focus (DOF ($\mu$m)) and the exposure tolerance (%) relative to the iso pattern and the L/S pattern under each mask condition and illuminating condition in FIGS. 2 to 5.

Table 2 shows the difference in the optimum exposure amount $E_{opt}$ between the iso pattern and the L/S pattern under each mask condition and illuminating condition.

TABLE 1

|  | BIM ordinal illumination | | BIM ½ annular illumination | | HTPSM ordinal illumination | | HTPSM ½ annular illumination | |
| --- | --- | --- | --- | --- | --- | --- | --- | --- |
|  | iso | L/S | iso | L/S | iso | L/S | iso | L/S |
| exposure tolerance (%) | 5.1 | 7.5 | 4.2 | 12.5 | 7.6 | 9.0 | 9.7 | 20.5 |
| DOF ($\mu$m) | 0.7 | 0.8 | 0.7 | 0.8 | 0.7 | 0.8 | 0.7 | 0.8 |

Maximum ED-Window under Each Mask Condition and Illumination Condition

TABLE 2

|  | BIM ordinal illumination | BIM ½ annular illumination | HTPSM ordinal illumination | HTPSM ½ annular illumination |
|---|---|---|---|---|
| optimum exposure amount in the case of 0.2 μm in the ios pattern | 36.3 | 29.2 | 52.0 | 41.6 |
| optimum exposure amount in the case of 0.2 μm in the L/S pattern | 35.7 | 30.3 | 54.0 | 46.5 |
| difference between the both optimum exposure amounts $E_{opt}$ | 0.6 | 1.1 | 2.0 | 4.9 |

Difference in The Optimum Exposure Amount $E_{opt}$ under Each Mask Condition and Illumination Condition FIGS. 6A to 6D show the common window of the ED-window in the iso and the ED-window in the L/S shown in FIGS. 2 to 5 respectively, and the exposure tolerance and the DOF of the common window under each mask condition and illuminating condition in this case is shown in Table 3.

The common ED-window proves to be the maximum in the combination of the HTPSM and ordinal illumination as shown in FIG. 6B, and in the conventional way, by using this as the optimum condition, mask bias OPC will be used in the next step. In this case, since the difference of $E_{opt}$ is small, as shown in Table 2, there is no possibility to improve the tolerance by the mask bias OPC.

TABLE 3

|  | BIM ordinal illumination | BIM ½ annular illumination | HTPSM ordinal illumination | HTPSM ½ annular illumination |
|---|---|---|---|---|
| exposure tolerance (%) | 5.0 | 6.0 | 7.4 | 2.8 |
| DOF (μm) | 0.7 | 0.4 | 0.7 | 0.7 |

Common ED-Window under Each Mask Condition and Illumination Condition

This embodiment employs the exposure condition indicating the maximum ED-window both in the iso pattern and in the L/S pattern, that is, the case of using the HTPSM and half shading annular illumination, as illustrated in FIG. 2. In this case, the mask bias OPC is used for the other pattern (in this example, the L/S pattern in FIG. 2B) so as to adjust it to the minimum ED-window (in this example, the ED-window of the iso pattern in FIG. 2A) by comparison of the ED-windows of the respective patterns, and the optimum exposure amount of the L/S pattern is approached to the optimum exposure amount of the iso pattern, which is shown in the range indicated by the curved lines 3a and 3b in FIG. 7. Since the optimum exposure amount of the L/S pattern is higher than that of the iso pattern by 4.9 mJ/cm2, the optimum exposure amount of the L/S pattern can be approached to the optimum exposure amount of the iso pattern by multiplying it by the minus bias. In this case, the optimum exposure amount of the L/S pattern becomes 40.4 mJ/cm2 by the bias OPC of mask 0.18 m and target 0.20 m, coming near to that of the iso pattern.

Figure 7:
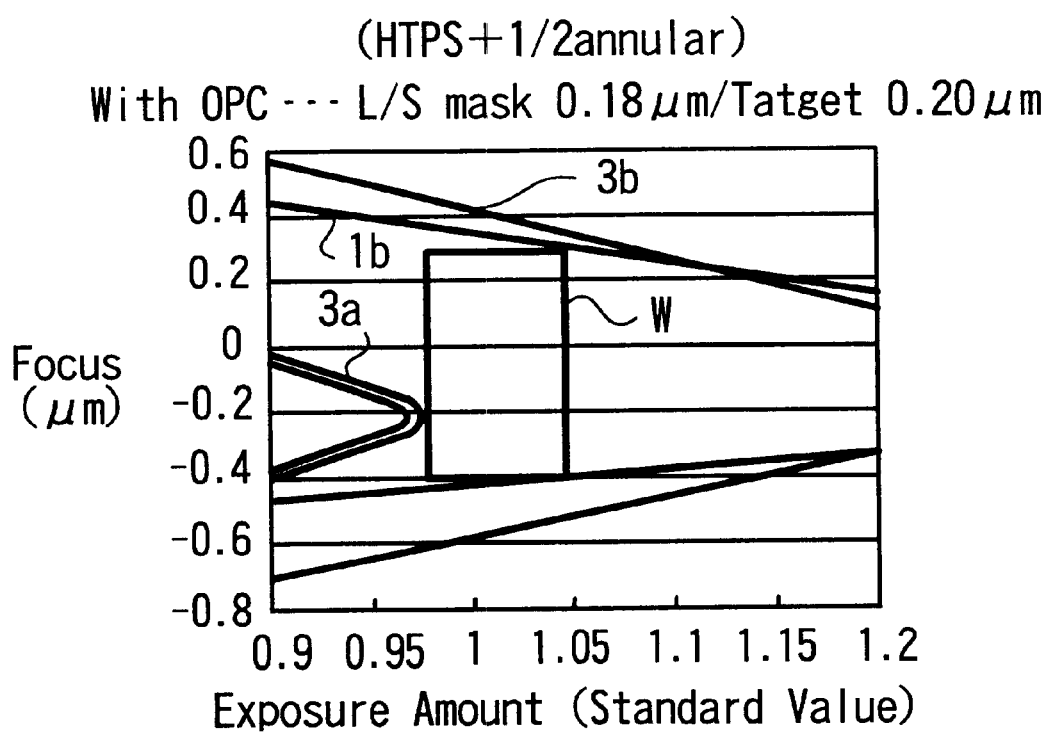
FIG. 7 is a view showing the exposure amount and focus tolerance of two patterns according to an embodiment of the method of the present invention.

In this case, though the ED-window will be deteriorated in the case of single L/S pattern, the common ED-window of the iso and the L/S will broaden as illustrated in FIG. 7. This becomes wider than the ED-window of FIG. 6B defined in the conventional way.

Table 4 shows the exposure tolerance and the DOF, by comparison, in the case of using the HTPSM and half shading annular illumination without OPC and with OPC, and in the case of using the HTPSM and the ordinal illumination in the conventional way.

TABLE 4

|  | HTPSM ½ annular illumination | | HTPSM ordinal illumination |
|---|---|---|---|
|  | without OPC | with OPC | (conventional way) |
| exposure tolerance (%) | 2.8 | 9.5 | 7.4 |
| DOF (μm) | 0.7 | 0.7 | 0.7 |

Enlargement of The Common ED-Window by Using OPC

As is apparent from the above-mentioned description, the pattern exposure method of the present invention can assure the larger depth of focus and exposure tolerance than the conventional way. Therefore, also in the case of having a pattern of different density on the same layer, it can perform the pattern exposure with excellent resolution and high accuracy.

Accordingly, in the manufacture of a semiconductor device, for example, in the case of having a memory portion and a logic portion mixedly, namely in the case of having a pattern different in density and configuration on the same layer, the pattern exposure method can be adopted in the photolithography process of the manufacturing process, so to accomplish preferable pattern exposure, thereby improving the defect rate and the reliability of the product.

Figure 8:
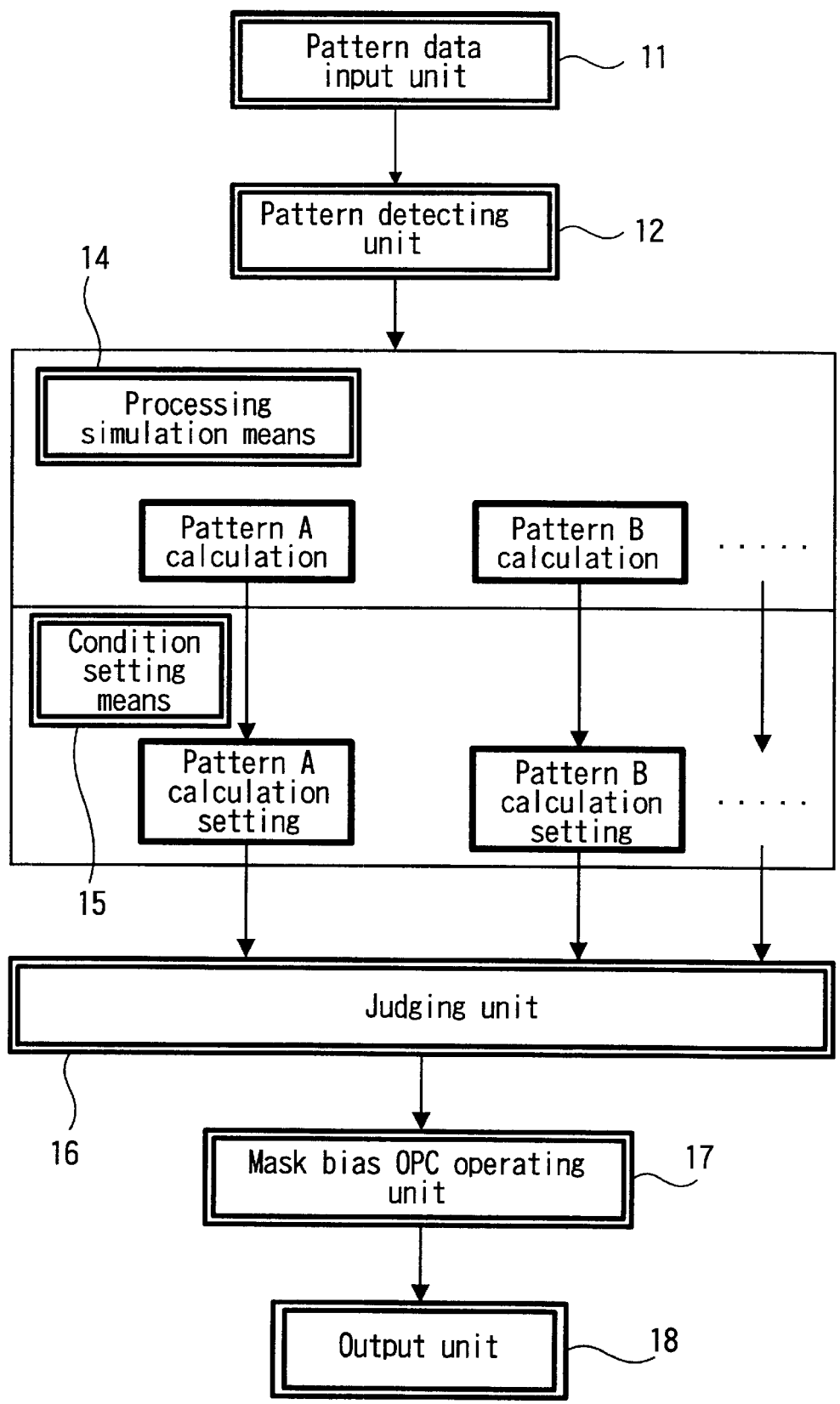
FIG. 8 is a view showing an example of the structure of a system used in the method of the present invention.

This time, the structure of a system for realizing the pattern exposure method according to the present invention will be described with reference to FIG. 8.

This system comprises, for example, a pattern data input unit 11, a pattern detecting unit 12 for detecting a portion of the same density and configuration pattern, a processing simulation means 14, a condition setting means 15, a judging unit 16, a mask bias operating unit 17, and an output unit 18.

In this system, pattern data of a desired exposure pattern on the same layer is entered into the pattern data input unit 11, and the pattern detecting means 12 detects each pattern portion obtained by dividing the pattern data into pattern portions each having the same density and the same configuration, namely, the divided patterns A, B, C, . . . corresponding to the above-mentioned work I.

Each data of the detected pattern A, pattern B, . . . is entered in the processing simulation means 14, where the process simulation is performed on all the exposure working conditions, such as N.A. σ, illuminating condition, focus distance, exposure amount, mask bias, mask type, and resist materials through the optical strength calculation.

Based on the calculation results relative to the pattern A, pattern B, . . . , the condition setting means 15 decides the above-mentioned conditions, for example, N.A. σ, illumination condition, focus distance, exposure amount, mask bias, mask kind, and resist materials. Namely, the operation corresponding to the above-mentioned work II is performed.

The judging unit 16 performs the operation corresponding to the above-mentioned work III of judging a pattern of the minimum tolerance, that is, the pattern A in the above example.

The mask bias OPC operating unit 17 performs the operation corresponding to the above-mentioned work IV of calculating to adjust the other patterns to the optimum condition of the pattern A judged to have the minimum tolerance by the judging unit 16 and operating the mask bias OPC for making the tolerance maximum.

Then, the information is obtained from output unit 18.

The system for use in the pattern exposure according to the present invention, however, is not restricted to the above-mentioned example.

Although the above example has been described in the case of obtaining a linear exposure pattern, the present invention can be adopted in an exposure pattern by a combination of various kinds of patterns.

As mentioned above, since the pattern exposure method according to the present invention can assure the larger depth of focus and exposure amount than the conventional way, pattern exposure of excellent resolution and accuracy can be performed also in the case of having a pattern different in density and configuration on the same layer.

Accordingly, in the manufacture of a semiconductor device, for example, in the case of having a memory portion and a logic portion mixedly, namely in the case of having a pattern different in density and configuration on the same layer, the pattern exposure method can be adopted in the photolithography process of the manufacturing process, so to accomplish preferable pattern exposure, thereby improving the defect rate and the reliability of the product, in a mass production.

The system of the present invention is to realize the above-mentioned method of the present invention.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A pattern exposure method in photolithography for performing optical exposure on a desired pattern having no uniformity in pattern density and pattern configuration, comprising:

a step of dividing the desired optical exposure pattern into pattern portions, each having a substantially same pattern density and pattern configuration and extracting the same portions;

a step of selecting an extracted pattern portion having a minimum tolerance on the exposure optimum condition, of the divided and extracted pattern portions, after said step of dividing into the pattern portions;

a step of selecting an extracted pattern portion having the minimum tolerance on the optical exposure optimum condition, of the divided and extracted pattern portions; and a step of obtaining each exposure optimum condition as for the divided and extracted pattern portions, after said process of dividing into the pattern portions.

2. A pattern exposure method as claimed in claim 1, comprising a step of adjusting the optimum exposure amount by optical proximity effect correction when applying the exposure optimum condition of the extracted pattern portion having the minimum tolerance to the other extracted pattern portions.

* * * * *